United States Patent
Bullock et al.

(10) Patent No.: US 6,674,053 B2
(45) Date of Patent: *Jan. 6, 2004

(54) ELECTRICAL, THIN FILM TERMINATION

(75) Inventors: Brian A. Bullock, Midvale, UT (US); Steven A. Black, Murray, UT (US)

(73) Assignee: Trebor International, West Jordan, UT (US)

(*) Notice: Subject to any disclaimer, the term of this patent is extended or adjusted under 35 U.S.C. 154(b) by 0 days.

This patent is subject to a terminal disclaimer.

(21) Appl. No.: 10/218,194

(22) Filed: Aug. 12, 2002

(65) Prior Publication Data

US 2003/0029860 A1 Feb. 13, 2003

Related U.S. Application Data

(63) Continuation of application No. 09/882,455, filed on Jun. 14, 2001, now Pat. No. 6,433,319.

(51) Int. Cl.$^7$ ............................. H05B 3/46; F24H 1/12
(52) U.S. Cl. ..................... 219/541; 219/534; 219/543; 392/480
(58) Field of Search ................. 219/534, 541, 219/543; 392/478, 479, 480, 482, 488

(56) References Cited

U.S. PATENT DOCUMENTS

| | | | |
|---|---|---|---|
| 3,493,428 A | 2/1970 | Hedberg et al. | 117/211 |
| 3,960,564 A | 6/1976 | Molenaar et al. | 430/16 |
| 4,072,243 A | 2/1978 | Conant et al. | 215/12 |
| 4,091,267 A | 5/1978 | Grant | 219/544 |
| 4,125,640 A | 11/1978 | Conant et al. | 427/250 |
| 4,145,601 A | 3/1979 | Lavrentiev | 219/298 |
| 4,401,879 A | 8/1983 | Shukla et al. | 219/206 |
| 4,420,544 A | 12/1983 | Lawson et al. | 429/13 |
| 4,479,074 A | 10/1984 | Bhalla | 313/628 |
| 4,516,814 A | 5/1985 | Ireland | 339/7 |
| 4,689,475 A | 8/1987 | Kleiner et al. | 219/553 |
| 4,707,586 A | 11/1987 | Voss et al. | 219/203 |
| 4,748,367 A | 5/1988 | Bloch et al. | 310/343 |
| 4,859,505 A | 8/1989 | Nakayama et al. | 427/305 |
| 4,889,974 A | 12/1989 | Auding et al. | 219/543 |
| 4,946,546 A | 8/1990 | Bourgeois-Moine | 156/643 |
| 4,948,707 A | 8/1990 | Johnson et al. | 430/11 |
| 4,978,814 A | 12/1990 | Honour | 174/130 R |
| 5,039,840 A | 8/1991 | Boardman | 219/270 |
| 5,057,674 A | 10/1991 | Smith-Johannsen | 219/553 |
| 5,183,795 A | 2/1993 | Ting et al. | 437/230 |
| 5,315,063 A | 5/1994 | Auclair | 174/78 |
| 5,388,177 A | 2/1995 | Ono et al. | 392/386 |
| 5,448,037 A | 9/1995 | Takase et al. | 219/547 |
| 5,493,102 A | 2/1996 | Takase et al. | 219/547 |

(List continued on next page.)

FOREIGN PATENT DOCUMENTS

| | | | |
|---|---|---|---|
| JP | 357119505 A | 7/1982 | |
| JP | 363153280 A | 6/1988 | 428/450 |

*Primary Examiner*—Joseph Pelham
(74) *Attorney, Agent, or Firm*—Pate Pierce & Baird

(57) ABSTRACT

An apparatus for operably connecting an electrical source to a conductive coating or film. The apparatus may include a substrate made of a structural material. A conductive coating or thin film may be applied to the substrate. An interface layer may be applied over the conductive coating and conduct electricity thereto while transferring insufficient force to separate the conductive coating from the substrate. A conductor, for providing electricity to the interface layer comprising strands configured to be separable and electrically conductive, may be positioned in contact with the interface layer. A clamping mechanism may apply a clamping load urging the conductor toward the conductive coating. The strands of the conductor may be formed to distribute mechanical stress and strain induced by thermal expansion and the clamping load sufficiently to substantially reduce damage to the mechanical and electrical integrity of the conductive coating.

16 Claims, 13 Drawing Sheets

U.S. PATENT DOCUMENTS

| | | | |
|---|---|---|---|
| 5,498,853 A | 3/1996 | Gross et al. | 219/461.1 |
| 5,573,692 A | 11/1996 | Das et al. | 219/543 |
| 5,616,266 A | 4/1997 | Cooper | 219/543 |
| 5,643,483 A | 7/1997 | Kubota et al. | 219/543 |
| 5,648,125 A | 7/1997 | Cane | 427/534 |
| 5,665,262 A | 9/1997 | Hajaligol et al. | 219/553 |
| 5,667,712 A | 9/1997 | Sutorius et al. | 219/535 |
| 5,750,958 A | 5/1998 | Okuda et al. | 219/267 |
| 5,877,474 A | 3/1999 | Konishi | 219/270 |
| 5,911,899 A | 6/1999 | Yoshikai et al. | 219/522 |
| 5,968,379 A | 10/1999 | Zhao et al. | 219/121.52 |
| 6,037,574 A | 3/2000 | Lanham et al. | 219/544 |
| 6,130,601 A | 10/2000 | Brown et al. | 338/307 |
| 6,141,870 A | 11/2000 | McDermott et al. | 29/852 |
| 6,146,700 A | 11/2000 | Yuan et al. | 427/304 |
| 6,172,344 B1 | 1/2001 | Gordon et al. | 219/529 |
| 6,222,166 B1 | 4/2001 | Lin et al. | 219/538 |
| 6,376,816 B2 | 4/2002 | Cooper et al. | 219/543 |
| 6,433,319 B1 | 8/2002 | Bullock et al. | 219/543 |
| 6,479,094 B2 | 11/2002 | Black | 427/101 |
| 6,544,583 B2 | 4/2003 | Black | 427/8 |

Section A

ELECTRICAL, THIN FILM TERMINATION

RELATED APPLICATIONS

This Patent Application is a continuation of U.S. patent application Ser. No. 09/882,455 filed on Jun. 14, 2001 which issued Aug. 13, 2002 as U.S. Pat. No. 6,433,319 entitled ELECTRICAL, THIN FILM TERMINATION.

BACKGROUND

1. The Field of the Invention

This invention relates to electrical terminations and, more particularly, to novel systems and methods for transferring electrical current from a lead to a thin film.

2. The Background Art

The semiconductor manufacturing industry relies on numerous processes. Many of these processes require transportation and heating of de-ionized (DI) water, acids, and other chemicals. By clean or ultra-pure is meant that gases or liquids cannot leach into, enter, or leave a conduit system to produce contaminants above permissible levels. Whereas other industries may require purities on the order of parts-per-million, the semiconductor industry may require purities on the order of parts-per-trillion.

Chemically clean environments for handling pure de-ionized (DI) water, acids, chemicals, and the like, must be maintained free from contamination. Contamination in a process fluid batch may destroy hundreds of thousands of dollars worth of product. Several difficulties exist in current systems for heating, pumping, and carrying process fluids (e.g., acids, DI water). Leakage into or out of a process fluid conduit must be eliminated. Moreover, leaching and chemical reaction between any contained fluid and the carrying conduits must be eliminated.

Elevated temperatures in semiconductor processing are often over 100 C, and often sustainable over 120 C. In certain instances, temperatures as high as 180 C may be approached. It is preferred that all process fluid heating and carrying mechanisms virtually remove the possibility of contact with any metals, regardless of the ostensibly non-reactive natures of such metals. It is desirable to prevent process fluid contamination, even in the event of a catastrophic failure of any element of a heating, transfer, or conduit system.

Conventional immersion heaters place a heating element, typically sheathed in a coating, directly into the process fluid. The heating element and process fluid are then contained within a conduit. Temperature transients in immersion heaters may overheat a sheath up to a melting (failure) point. A failure of a sheath may directly result in metallic or other contamination of the process fluid. Meanwhile, temperature transients in radiant heaters may fracture a rigid conduit.

A heating alternative is needed that does not have the risks associated with conventional radiant and immersion-heating elements. A system is needed that is both durable and responsive for heating process fluids. Failure that may result in fluid contamination is an unacceptable risk.

BRIEF SUMMARY AND OBJECTS OF THE INVENTION

It is a primary object of the present invention to provide a heater for handling process fluids at elevated temperatures in the range of 0 C to 180 C. It is an object of the invention to provide a heater having electrical resistance in close proximity to a process fluid for heating by conduction and convection without exposing process fluids to contamination, even if electrical failures or melting of conductive paths should occur within a heater.

Consistent with the foregoing objects, and in accordance with the invention as embodied and broadly described herein, a method and apparatus are disclosed in one embodiment of the present invention as including a heater comprising a substrate. The substrate may be formed of a material having suitable strength, heat transfer characteristics, non-reactivity, and coating adherence. The substrate may function to separate a heating element from the fluid to be heated. The substrate may have any suitable shape which may promote efficient heat transfer to the fluid passing thereacross. In certain embodiment, the substrate may be formed as a conduit to transfer the fluid.

In one embodiment, the substrate is one or more tubes of quartz. In such an embodiment, the tubes may be abutted end-to-end with an adapter (e.g. fluorocarbon fitting) fitted to transfer the fluids between two tubes in a series. One pass or passage, comprising one or more tubes of quartz in a series, may be fitted on each end to a manifold (e.g. header/footer) comprised of a fluorocarbon material properly sealed for passing liquid into and out of the individual passage.

Individual tubes or conduits may improve the temperature distribution therein by altering the internal boundary layer of heated fluids passing therethrough. In one embodiment, a baffle tube, within the outer tube, may have a plug serving to center the baffle in the heating tube. The plug may restrict flow, such that the fluid inside the baffle does not change dramatically. Thus an annular flow between the baffle tube and the outer heating tube may maintain a high Reynolds number in the flow, enhancing the Nusselt number, heat transfer coefficient and so forth. Moreover, the temperature distribution may be rendered nearer to a constant value across the annulus, rather than running with a cold, laminar core. In one embodiment, a heater may be manufactured by depositing, plating, or otherwise adhering a resistive coating or layer to a surface of the substrate. The resistive coating may be any material having a proper balance of conductivity, resistivity, and adherence. In certain embodiments, the substrate surface may be roughened or otherwise prepared to promote adherence of the resistive coating thereto. In one embodiment, electroless nickel may be plated on a roughened (textured) surface of the substrate.

A resistive, conductive coating may extend along any selected length of the substrate. The resistive coating may be configured to connect in series or to multi-phase power along the length of a single substrate. In one embodiment, a quartz tube may be roughened, etched, dipped, coated, and protectively coated. The quartz tube need not be heated to sinter the conductive layer. The conductive coating may be plated as a continuous ribbon of well-adhered, resistive, conducting, metallic material.

The electrical length of the heated portion (i.e. the area coated with the resistive coating) may be adjusted by application of an end coating for distributing current. Electrical current may be applied to the end the coating or directly to the resistive coating by any suitable termination. In selected embodiments, a electrical lead may be soldered to directly to the end coating. In other embodiments, a conductor may be applied against the end coating. The conductor may be formed of multiple conductive strands. The strands may be formed to distribute mechanical and electrical loads substantially evenly across the entire termination zone. The size of the termination zone area may be selected to provide an acceptable current density such that thermal and mechanical loads do not become excessive at any one location. In one embodiment, the conductor may be a braided strap. A clamp may urged the conductor against the end coating, resistive coating, or some other interface layer applied to the substrate. The clamp may maintain the conductor against the underlying surface, while accommodating expansion with temperature, without harming mechanical bonds between the resistive coating and the substrate.

BRIEF DESCRIPTION OF THE DRAWINGS

The foregoing and other objects and features of the present invention will become more fully apparent from the following description and appended claims, taken in conjunction with the accompanying drawings. Understanding that these drawings depict only typical embodiments of the invention and are, therefore, not to be considered limiting of its scope, the invention will be described with additional specificity and detail through use of the accompanying drawings in which:

DETAILED DESCRIPTION OF THE PREFERRED EMBODIMENTS

It will be readily understood that the components of the present invention, as generally described and illustrated in the Figures herein, could be arranged and designed in a wide variety of different configurations. Thus, the following more detailed description of the embodiments of the system and method of the present invention, as represented in the FIGS. 1 through 13, is not intended to limit the scope of the invention, as claimed, but is merely representative of the presently preferred embodiments of the invention.

The presently preferred embodiments of the invention will be best understood by reference to the drawings, wherein like parts are designated by like numerals throughout. Those of ordinary skill in the art will, of course, appreciate that various modifications to the detailed schematic diagram may easily be made without departing from the essential characteristics of the invention, as described in connection with the Figures. Thus, the following description of the Figures is intended only by way of example, and simply illustrates certain presently preferred embodiments consistent with the invention as claimed herein.

Figure 1:
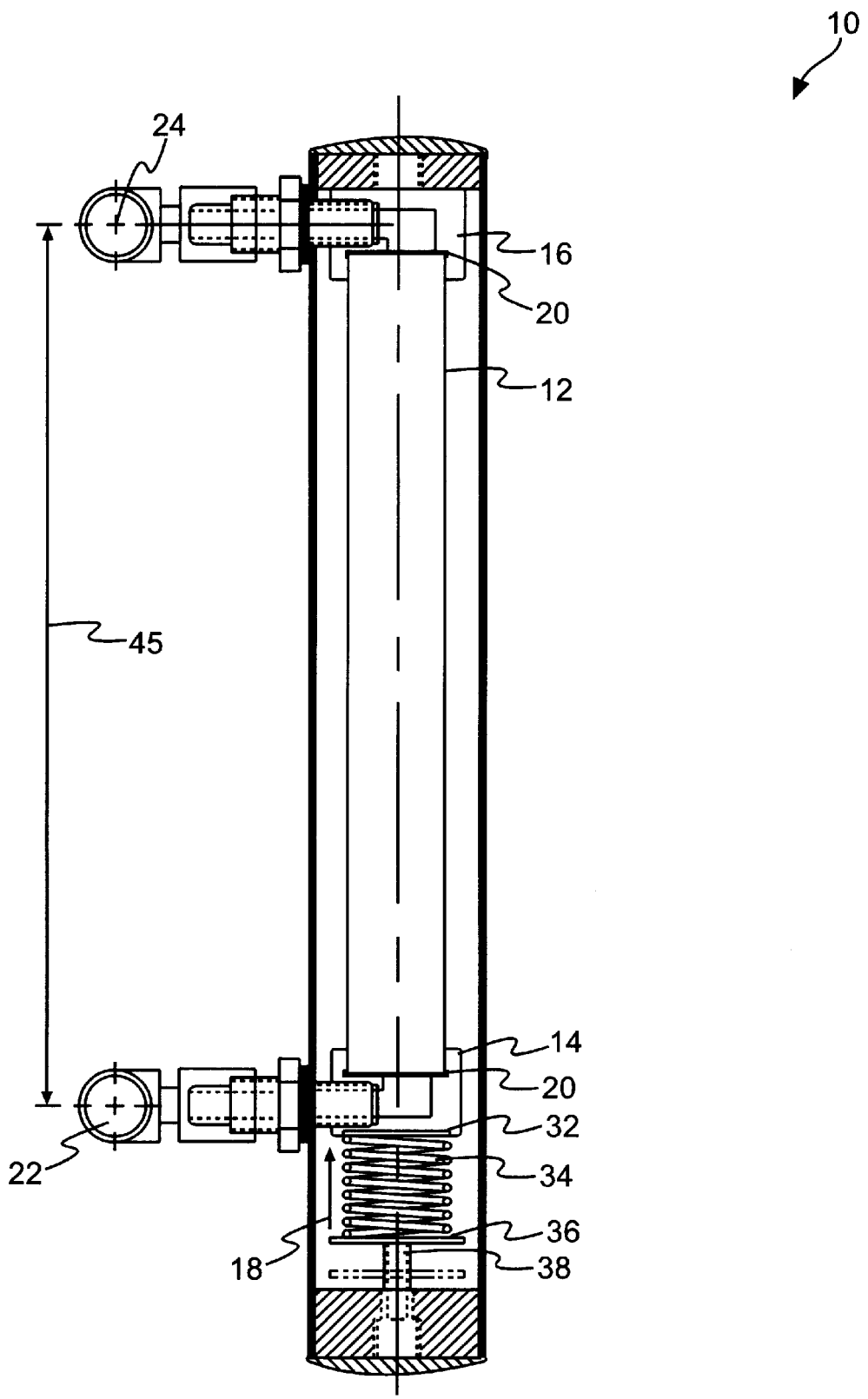
FIG. 1 is a side elevation view of a heater unit in accordance with the invention.
Figure 2:
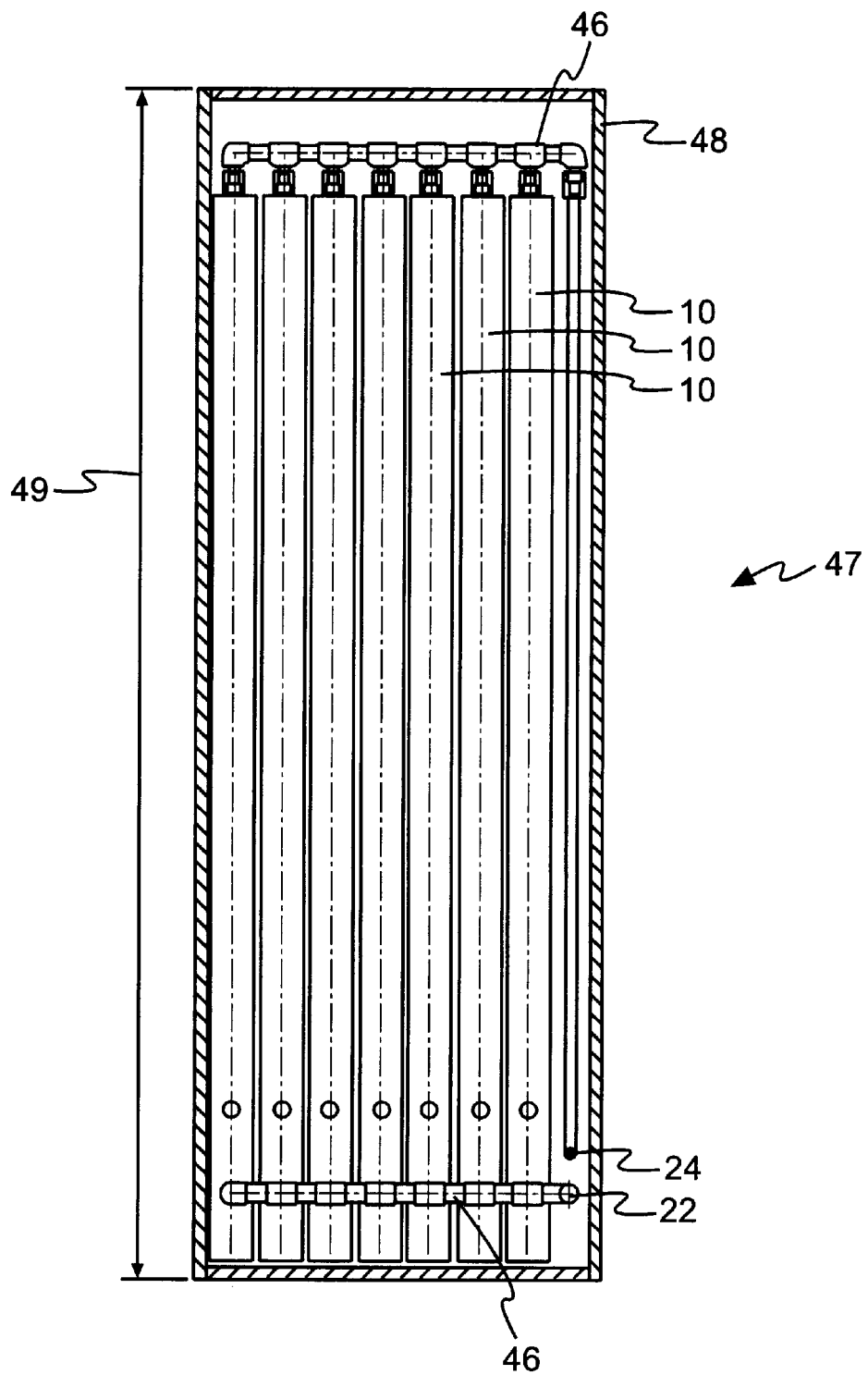
FIG. 2 is a front elevation view of a heater assembly including multiple units of the apparatus illustrated in FIG. 1.
Figure 3:
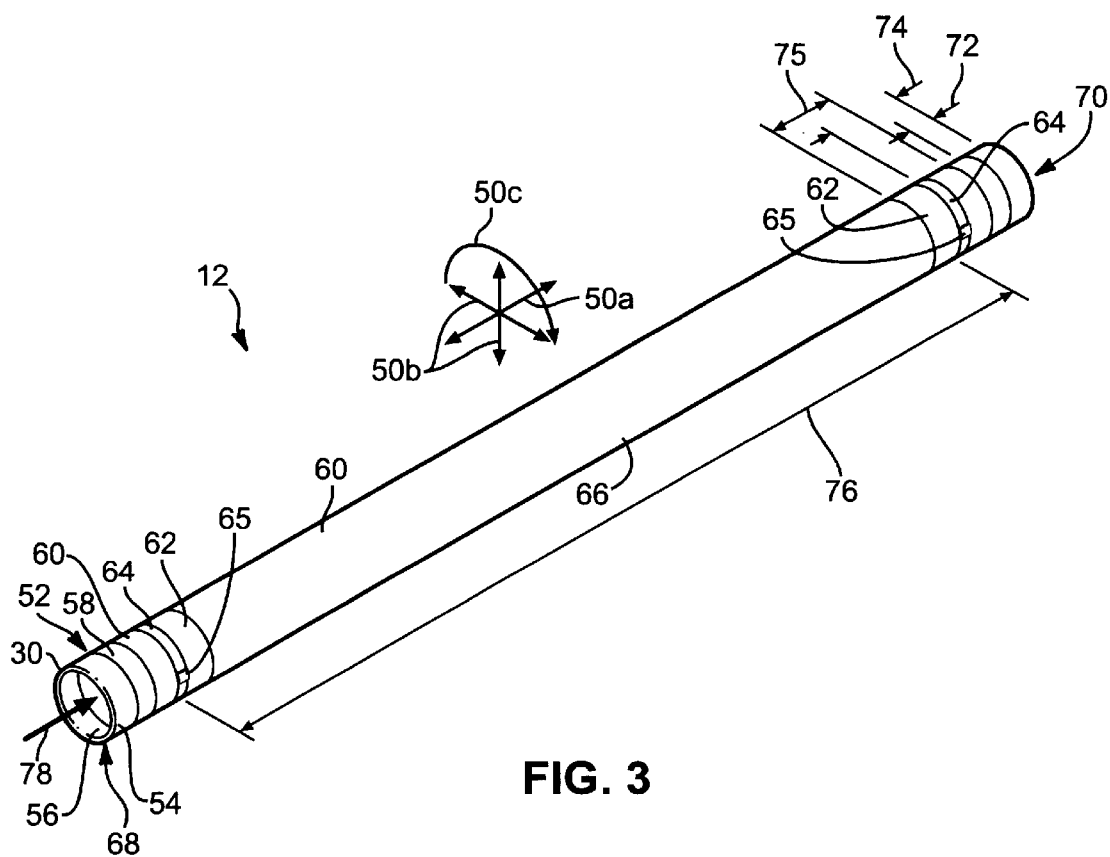
FIG. 3 is a perspective view of one embodiment of a coated conduit in accordance with the invention.

Referring to FIGS. 1–3, an apparatus 10 may be created for heating or otherwise handling process fluids such as those used in the semiconductor industry. The semiconductor-processing industry requires ultra-pure, de-ionized (DI) water, acids, and the like. A conduit 12 may be formed of a comparatively rigid material such as quartz.

Fused quartz resists distortion due to changes in temperature and time, providing dimensional stability and repeatable structural properties. Additionally, quartz is substantially non-reactive with processing fluids and meets industry parts-per-billion (or even trillion) purity requirements in acids and water, such as de-ionized water.

Fittings 14, 16 may support the conduit 12 and apply force 18 from a pressure plate 32, loader (e.g., spring) 34, baseplate 36 and adjuster 38 to support a suitable seal 20. An inlet 22 and outlet 24 may convey fluid along the length 45 of the apparatus 10 from a manifold 46. A plurality of the individual apparatus 10 may be assembled as a heater 47 in a cabinet 48 or outer frame 48 enclosing an outer envelope 49.

The heater 47 does not expose metals to the process fluid inside the conduits 12. In one presently preferred embodiment, a resistive coating on the conduit 12 heats the conduit 12. The heat passes through the wall of the conduit 12 into the process fluid therein.

Referring to FIG. 3, a conduit 12 may be formed of a crystalline material such as fused quartz. In general, a conduit 12 may be of any suitable shape. For example, a flat plate may be fitted, as a window, or the like, against a structure suitable for sealing the window. A coating may be applied to such a substrate. Accordingly, the term conduit 12, may include any substrate, of any shape, suitable for receiving a coating for generating electrical resistance heating.

The conduit 12 may define an axial direction 50a and radial directions 50b. A wall 52 of the conduit 12 may extend in an axial direction 50a and circumferentially 50c. The wall 52 may define, or be defined by, an outer surface 54 and an inner surface 56.

In selected embodiments, an outer surface 54 may be treated, such as by mechanical etching, to provide a portion of roughened surface 58. The textured surface 58 may be prepared by a mechanical abrasive action, such as grit blasting, bead blasting, or sandblasting. Accordingly, in a crystalline material, such as quartz, small crystalline chunks may be removed from the surface 54, leaving small, angular, crystalline inclusions in the surface 54.

The techniques and materials used in the preparation and coating of the outer surface 54 may be used to coat an inner surface 56. For example, the wall 52 may be treated to provide a textured surface on the inner surface 56. Concentric conduits 12 may be employed to provide additional heating. In such an embodiment, the inside surface 56 of the inner conduit 12 may be provided with a heater 10 while the outside surface 54 of the outer conduit 12 is provided with another heater 10. The fluid may then be heated at both the inner flow and outer flow extremes without being exposed to any potential contamination.

The coating 60 may typically be a substantially continuous film 60 extending over the area of the substrate to which the heat is to be applied. In a heating conduit 12 embodiment, the coating 60 may extend axially 50a and circumferentially 50c about the outer surface 54. An end coating 62, applied over the basic coating 60, may be formed of the same material, a similar material, or a material having different mechanical properties. The end coating 62 may be of any suitable material selected to maintain mechanical integrity and adherence between the coating 60 and the textured surface 58. In certain embodiments, the end coating 62 may be applied by a method other than depositing or plating. In alternative embodiments, the end coating 62 may simply be additional material, identical to the coating 60. The end coating 62 may decrease the resistance of the coating 60 by providing increased cross-sectional area along a portion of the length. Thus, the end coating 62 effectively shortens the resistive coating 60.

The end coating 62 may provide less resistance along a given direction 50a, 50c than the resistive coating 60. That is, the end coating 62 may include more material per unit of area in order to distribute electricity from a connector lug 64 in an axial 50a and a circumferential direction 50c. Thus, the end coating 62 becomes a distributor or a manifold for electricity provided to a lug 64 or connector 64 suitable for receiving a wire delivering current to the resistive coating 60.

A protective coating 66 of a suitable, conformal material may be applied to reduce scratching, wear, and chemical reaction of the resistive coating 60, thus extending the operational lifetime thereof. The applied coatings 60, 62, 66 need not extend from end 68 to end 70 of the substrate 12. A distance 72 of smooth surface 54 may remain in order to support sealing of the ends 68, 70 as described herein. Smooth, fired, quartz formed in a lip 30 may provide sealing, strength, manufacturing, and handling advantages.

A lug 64 or band 64 may serve as a base 64 for a connection 65 for electrical power inputs. The lug 64 may be spaced a selected distance 74 from either end 68, 70 of the conduit 12. A end coating 62 of conductive material may distribute electricity to the resistive coating 60. The end coating 62 may be placed at any suitable location along the length of the of the conduit 12.

Electricity travels between the bands 64 and end coatings 62 along a resistance length 76. Power dissipation for heating requires current and resistance. The resistivity and conductivity of the coating 60 may be selected and balanced to generate a desired wattage dissipation per unit area. Accordingly, the resistivity and conductivity of the coating 60 may be controlled by selecting coating 60 thickness and length 76.

The coating 60 may be designed and applied within parameters engineered to balance several factors. For example, if the textured surface 58 is too rough, the conduit 12 may fail under test pressures. If insufficiently rough, the textured surface 58 may provide inadequate adhesion forces between the resistive coating 60 and the outer surface 54 of the conduit 12 or substrate 12.

The resistive coating 60 may be benefitted from uniformity of conductivity and cross-sectional area along the length 76 in an axial direction 50a. An excess of the coating 60 may promote unitary motion thereof. With the application of thermal and mechanical loads, the unitary motion of the resistive coating 60 may mechanically separate the resistive coating from the textured surface 58. This may be particularly evident when dealing with material having different coefficients of thermal expansion. Ceramics and other materials, such as quartz, have very low coefficients of thermal expansion. In contrast, most metals provide substantial expansion with increased temperature. Accordingly, at elevated temperatures, the coating 60 tends to expand and separate as a continuous annulus surrounding the conduit 12.

At a microscopic level, the coating 60 tends to shear away from the microscopic inclusions developed in the textured surface 58. Thus, a balance in application of the coating 60 is required to balance the forces due to thermal expansion with the mechanical bond between the coating 60 and the inclusions in the textured surface 58.

The effective resistance of the coating 60 changes as the coating 60 is heat treated. Heat treatment does not melt the deposited coating 60. Nevertheless, metallurgical grain boundaries form, grow, and affect electrical conductivity in the coating 60. If the effective resistance is too high, the heater 10 may not provide sufficient energy input through the wall 52 into a fluid flow 78. If the resistance is too low, the heater 10 may provide an output outside the desired range of control. In some apparatus, excessive heating may damage equipment, including fracturing solids as a result of differentials in expansion.

The end coating 62 or band 62, if applied too thickly, may overcome the adhesion or other bonding between the end coating 62 and the resistive coating 60. Alternatively, the end coating 62 may maintain a sufficient bond with the coating 60, but separate the coating 60 from the textured surface 58. This is particularly common if either the resistive coating 60, end coating 62, or their combination is too thick and mechanically rigid. Similarly, as with the resistive coating 60, applying the end coating 62 too thinly, tends to reduce the average number of atoms at any site, yielding poor uniformity, and inadequate process control for reliable current conduction.

Excessive resistance in the end coating 62 may generate too much heat. Excessive heat may destroy the connection between the end coating 62 and the resistive coating 60, or separate both from the textured surface 58.

A lug 64 or connector band 64 may be secured with the same considerations required for the coatings 60, 62. Namely, excess material may provide excessive strength and generate unitary motion. Additionally, insufficient material may create hot spots. The lug 64 or connector band 64 materials may be selected to provide flexibility, malleability, elasticity, and plasticity.

Figure 4:
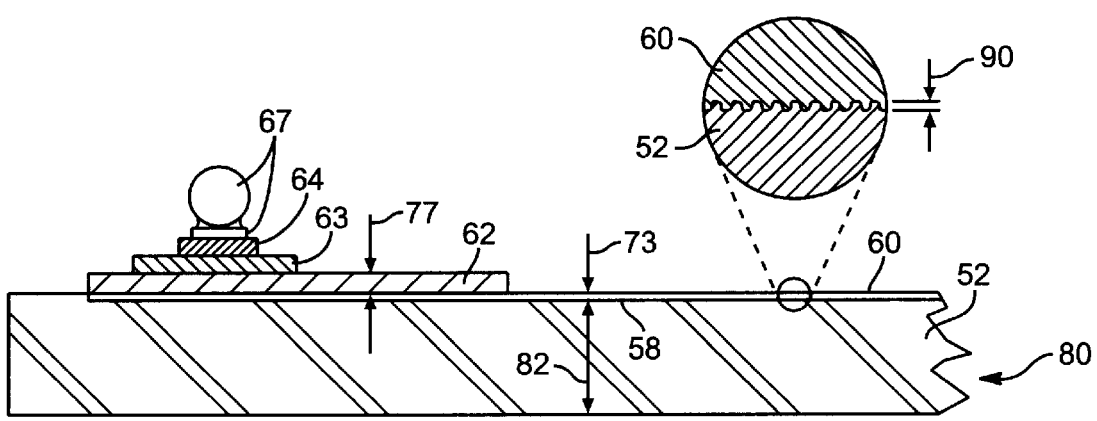
FIG. 4 is a schematic, side, elevation, cross-section view of a portion of the apparatus of FIG. 3, illustrating the comparative positions of the substrate, resistive coating, end plating (coating), and connection scheme for introducing electricity to the apparatus.

Referring to FIG. 4, a wall 52 may be thought of as a substrate 80. Thus, a substrate 80 may generalize a conduit 12 into any particular shape, open, closed, and so forth. As discussed, a thickness 82 of a substrate 80 provides mechanical integrity and strength in a conduit 12. In use, the conduits 12 may have internal pressure loads applied thereto. Excessive thickness 82 may generate a stress differential between the inner and outer surfaces 56, 54. Additionally, the thickness 82 may be affected by the inclusions in the textured surface 58. The thickness 82 may benefit from being sufficiently large in comparison to the inclusions of the textured surface 58, thus mitigating the risk of crack propagation.

The thickness 73 of the resistive coating 60 may be precisely controlled. The thickness 73 may be on the order of numbers of atoms up to a few millionths of an inch. In selected embodiments, the thickness 73 is selected to be within an order of magnitude of the size of inclusions in the textured surface 58. In an alternative embodiment, the thickness 73 may be selected to be more than an order of magnitude smaller than the size of inclusions in the textured surface 58. Accordingly, the coating 60 may appear like a crepe material. This crepe may be a thin, crinkly film following the peaks and valleys of the inclusions formed in the textured surface 58.

Thermal expansion due to a rise in temperature may be accommodated by localized bending of portions of the coating 60. If the thickness 73 becomes too great, however, the coating 60 behaves as a beam extending in the circumferential direction 50c and the axial direction 50a. Accordingly, the beam may change diameter, applying comparatively large radial forces withdrawing the small irregularities from their places filling the inclusions in the textured surface 58.

Excellent thermal contact between the coating 60 and the conduit 12 requires superior adhesion by selecting an appropriate thickness 73. The thickness 73 may be successfully selected to provide mechanical compliance with the textured surface 58 while providing uniformity. Thus, the selection of the resistive material 60, thickness 73, and substrate thickness 82 may be used to control heat input for a fluid flow 78 while maintaining mechanical integrity and thermal conductivity.

A interface layer 63 may be selected from a softer material than the coating 60. Selecting an interface layer 63 material that is comparatively malleable and thin, while having comparatively higher electrical conductivity than the coating 60, may produce suitable mechanical and electrical integrity.

A roughness level or inclusion height 90 may be detected by the reflection of light or sheen of the roughened surface 58. The roughness height 90 dramatically affects the sheen of the roughened surface 58, even with comparatively minimal roughness 90. Thus, the adequacy of the roughness height 90 may be detected as well as gauged by a visual inspection.

Excessive roughness height 90 may result from removing too much of the wall 52 from the textured surface 58. Controlling grit size (e.g. bead size) and time of application may provide a suitable roughness height 90. The roughness height 90 should accommodate mechanical lodgment of atoms of the coating 60 within inclusions in the surface. Thus, micro-mechanical anchors grip the thin coating 60 an maintain it against the outer surface 54.

The quality of the roughness height 90 may be additionally be gauged by the crystalline sharpness and angularity of the inclusions. Spalling of substrate 12 material from the outer surface 54 under the influence of grit, bead, sand blasting, or the like may tend to break the substrate along crystal boundaries. In this manner a fully randomized set of inclusions, including concavities overhung by sharp crystalline corners, may be provided. Such inclusions may securely capture pockets of atoms of the coating 60.

The resistive path of the coating 60 may be affected by the roughness height 90. A smooth outer surface 54 tends to provide a direct current path. A textured surface 58, provides an indirect path over hills and valleys of the inclusions formed in the textured surface 58. Thus, providing too great a thickness 73 of the resistive coating may decrease resistivity reducing the heating dissipation below a desired value.

Figure 5:
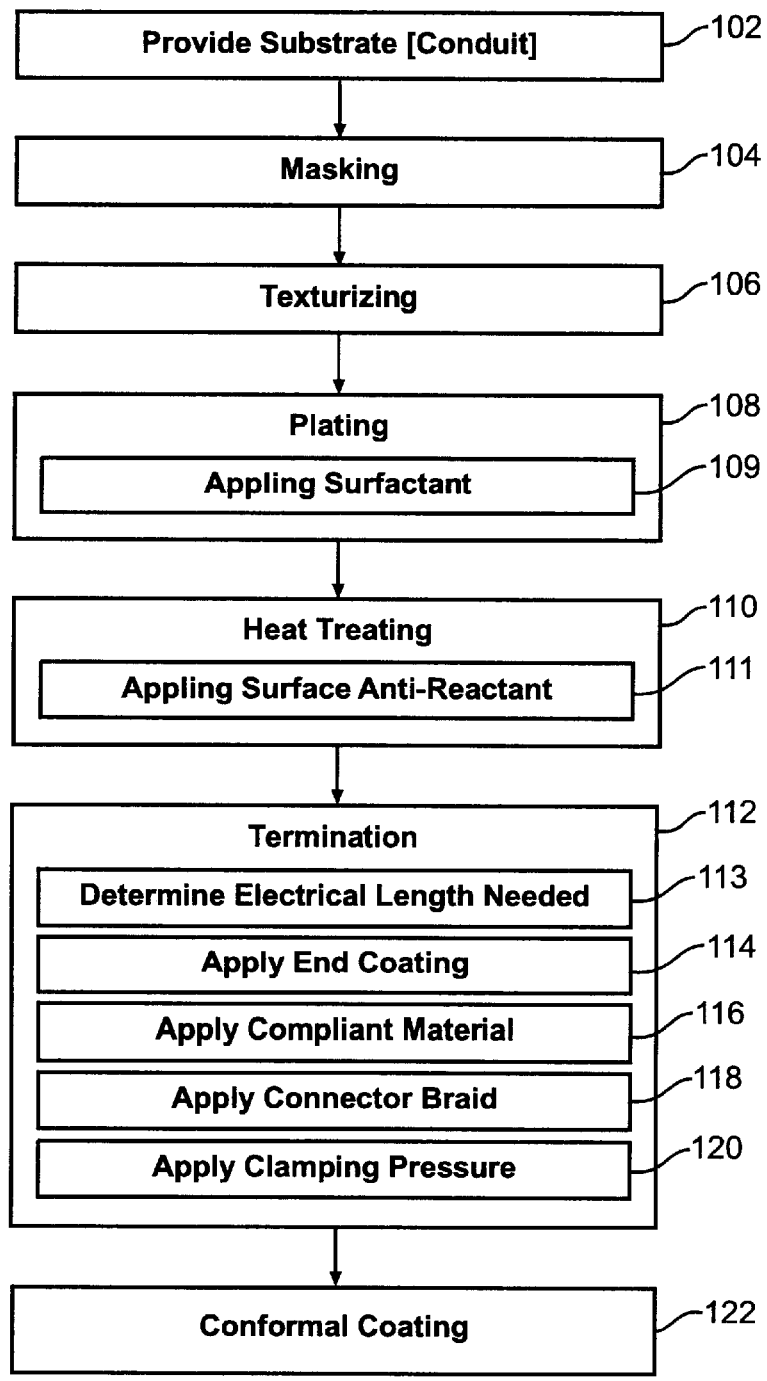
FIG. 5 is a block diagram of one embodiment of a process for making a heating unit in accordance with the invention.

Referring to FIG. 5, a method for manufacturing the heater 10 in accordance with the present invention may include providing 102 the conduit 12 or other substrate 80, followed by suitable masking 104 and texturing 106. Texturing 106 may include bead blasting, sand blasting, grit blasting, or etching by other means. In selected embodiments, bead blasting may provided considerable uniformity in the fracture mechanics of forming inclusions in a substrate without sacrificing mechanical integrity thereof. The texturing 106 may provide mechanical grip, as discussed hereinabove. The roughness height 90 may be selected to create inclusions that will not compromise the mechanical integrity of the conduit 12.

The wall thickness 82 may be selected to balance heat transfer and structural advantageous. Thermal gradients may be considered in view of the substrate thickness 82 and thermal stresses created by changing temperatures of the apparatus 10.

A thin film 60 is applied in a plating process 108. In one embodiment, electroless nickel plating forms a suitable resistive coating 60. The plating process may be continued for a time selected to provide a desired thickness 73. The thickness 73 of the resistive coating 60 may be selected to balance current-carrying capacity of the coating 60, mechanical stiffness and strength limits required to maintain adhesion, and coating uniformity. In certain embodiments, balancing involves adjusting resistive coating thickness 73 to achieve uniformity of performance, either mechanical, thermal, electrical, or a combination thereof.

The plating process 108 may be selected from the group consisting of vapor deposition, sputtering, painting, sintering, powder coating, and electroless plating. In electroless plating, such as electroless nickel plating, application 109 of a surfactant may greatly improve the quality of the coating 60. Application 109 of a surfactant may involve a surfactant scrub 109 in which vigorous application of force breaks down any pockets of gas that might adhere to concavities in the textured surface 58. Thereafter, the coating 60 may form, maintaining a continuous mechanical structure about the inclusions of the textured surface 58.

After the resistive coating 60 has been applied 108, it may be advantageous to heat treat 110 the substrate 12 and coating 60. In one embodiment, the heat-treating process 110 involves a metallurgical heat treatment 110. Such a process 110 does not elevate temperatures sufficiently to melt the metallic coating 60. Rather, temperatures are elevated, raising the energy level of various atoms within the coating 60, to encourage migration of interstitial materials. Migration of interstitial materials may foster growth of various grain boundaries. Growth of grain boundaries affects the binding of electrons into orbitals of various atomic or molecular structures. Thus, the heat-treating process 110 may substantially affect electrical conductivity. Accordingly, the time and temperature of the heat treatment process 110 may provide a control over the effective electrical resistivity of the coating 60.

In certain embodiments, heat treating 110 may include a surface treatment. In one embodiment, an application 111 or deposition 111 (e.g. vapor deposition) of a surface-protecting layer may include adding a composition (e.g., a silicate) to the heat-treatment environment. The application process 111 may include masking portions of the coating 60 that may later be coated with additional conductive materials. The protective process 111 provides a non-reactive coating or passivating coating to reduce oxidation of the resistive coating 60 during heat treating 110.

Following the heat-treating process 110, a termination process 112 provides end coatings 62. The placement of the termination may be influenced by a determination of the electrical length 113 needed to provide appropriate heating. In certain embodiments, the termination process 112 may include application 114 of a termination coating 62 or end coating 62 to reduce the resistance of the heater 10. Resistance may be lowered by half an order of magnitude. The thickness 77 of the end coating 62 must be balanced to provide good current distribution, without compromising the mechanical integrity of the bond between the conductive-resistive materials and the conduit 12 or substrate 80.

In selected embodiments, the termination process 112 may involve application 114 of an end coating 62 having a specific length 75 calculated to provide a precise power delivery in the heater 10. Similarly, a soft, compliant, conductive material may be added 116 over a portion of the end coating to form an interface layer 63 for receiving a connector 65. The connector 65 may be any suitable electrical connection. In one embodiment, the connector 65 is an electrical lead 65 electrically secured to the interface layer 63 or some other underlying layer (e.g. end coating 62, conductive coating 60). In an alternative embodiment, the band 64 may be formed to transfer electricity to the conductive coating 60. In such an embodiment, a braid 64 may be applied 118. After application of the braid 64, a clamping mechanism 67 may be applied. The clamp 67 may be adjusted (e.g. tightened) to apply a clamping pressure 120. The clamping pressure may urge the braid 64 against the underlying layers. A protective, conformal coating 66 may be applied 122 following, or as part of, the termination process 112.

Figure 6:
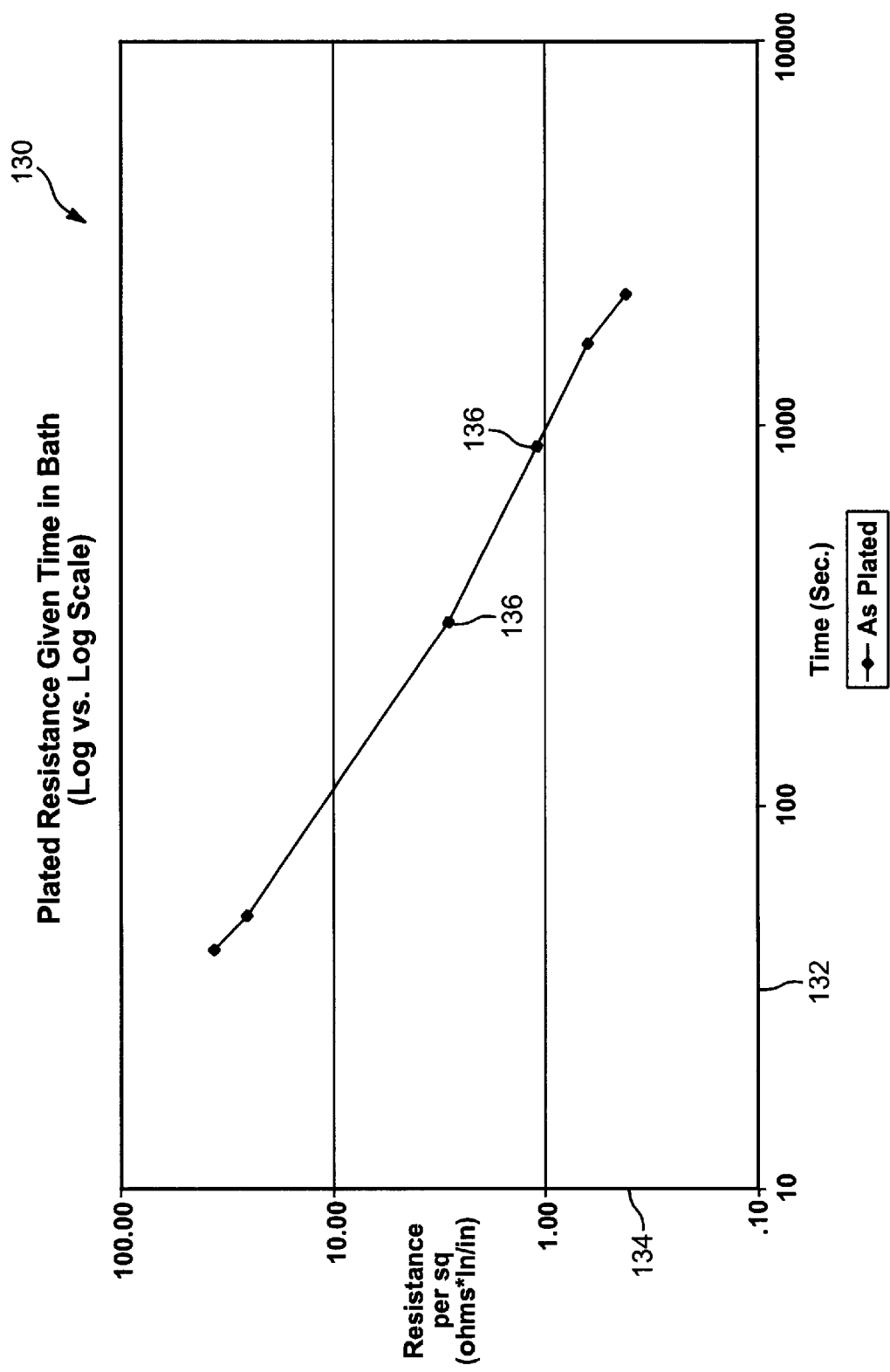
FIG. 6 is a graph illustrating a relationship between a bath time in a plating composition, illustrating the effect of normalized resistance per square in ohm-inches per inch.

Referring to FIG. 6, a graph 130 having a time axis 132 and resistance axis 134 illustrates various experimentally derived data points 136. The values 136 characterize the effect of time, during plating, on the initial resistance 134 of the coating 60. The scales are logarithmic. Thus, the process results in resistance being dependent upon a power of time. The relationship does not appear to change dramatically at any point on the graph 130.

Figure 7:
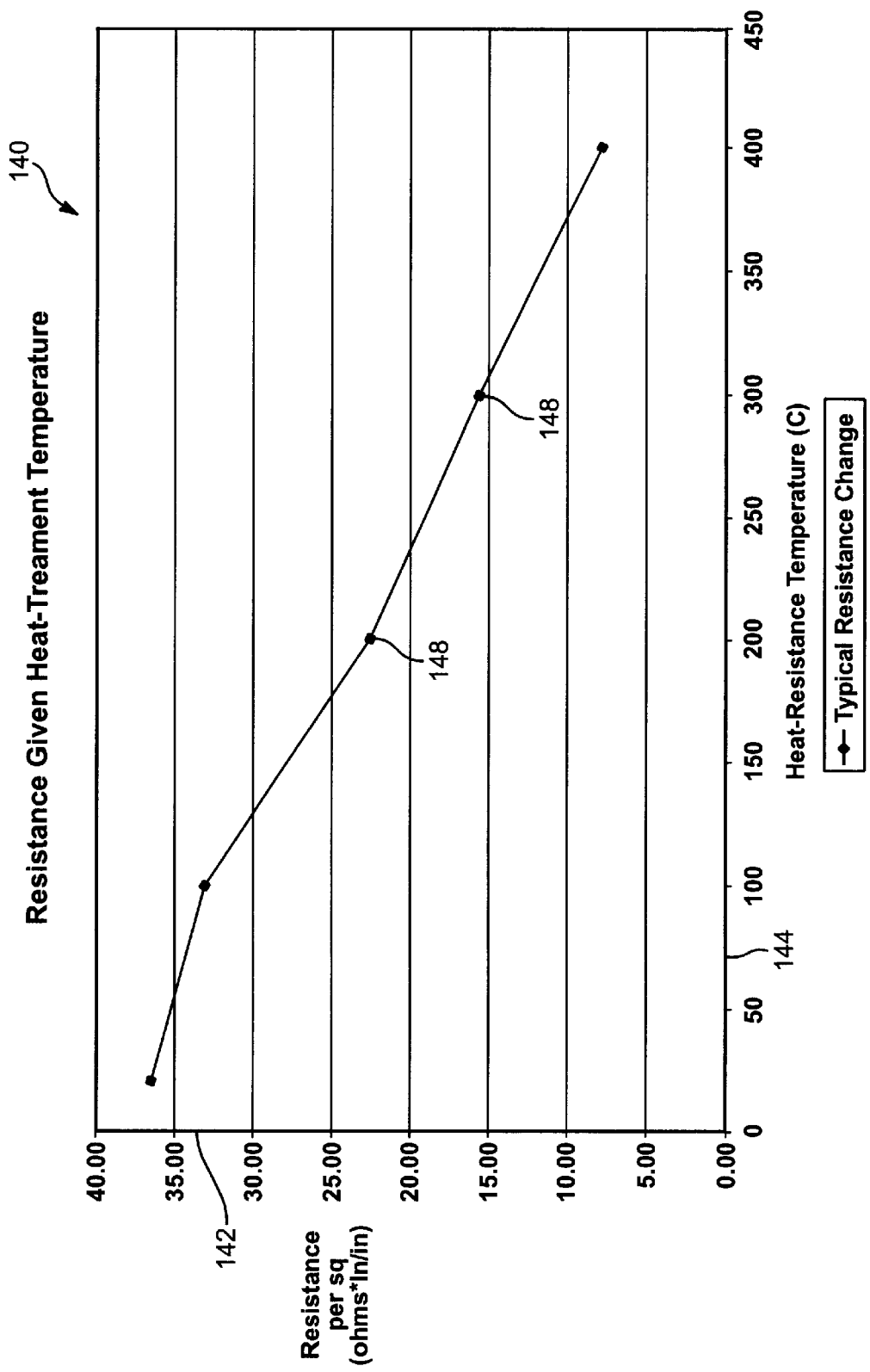
FIG. 7 is a graph illustrating a comparison between terminated resistance and watt density in a heater in accordance with the invention as a function of the cured resistance of a coating in accordance with the invention, further illustrating typical termination resistance adjustment depending upon the cured resistance of a conductive and resistive coating.

Referring to FIG. 7, a graph 140 of a resistance in a range 142 corresponds to a value of heat-treat temperature in a domain 144 of temperatures for the coating 60. The values 148 reflect the adjustment of resistance in ohm-inches per inch, due to a particular temperature during heat treating of the coating 60. The resistance of the coating 60 may vary due to variations in controlled parameters, such as the time and temperature associated with heat treatment. Parametric controls may vary during the plating process, and the heat-treating process 110. Thus, FIG. 7 reflects an ability to adjust the effective resistance of the apparatus 10 according to the heat-treat temperature.

Figure 8:
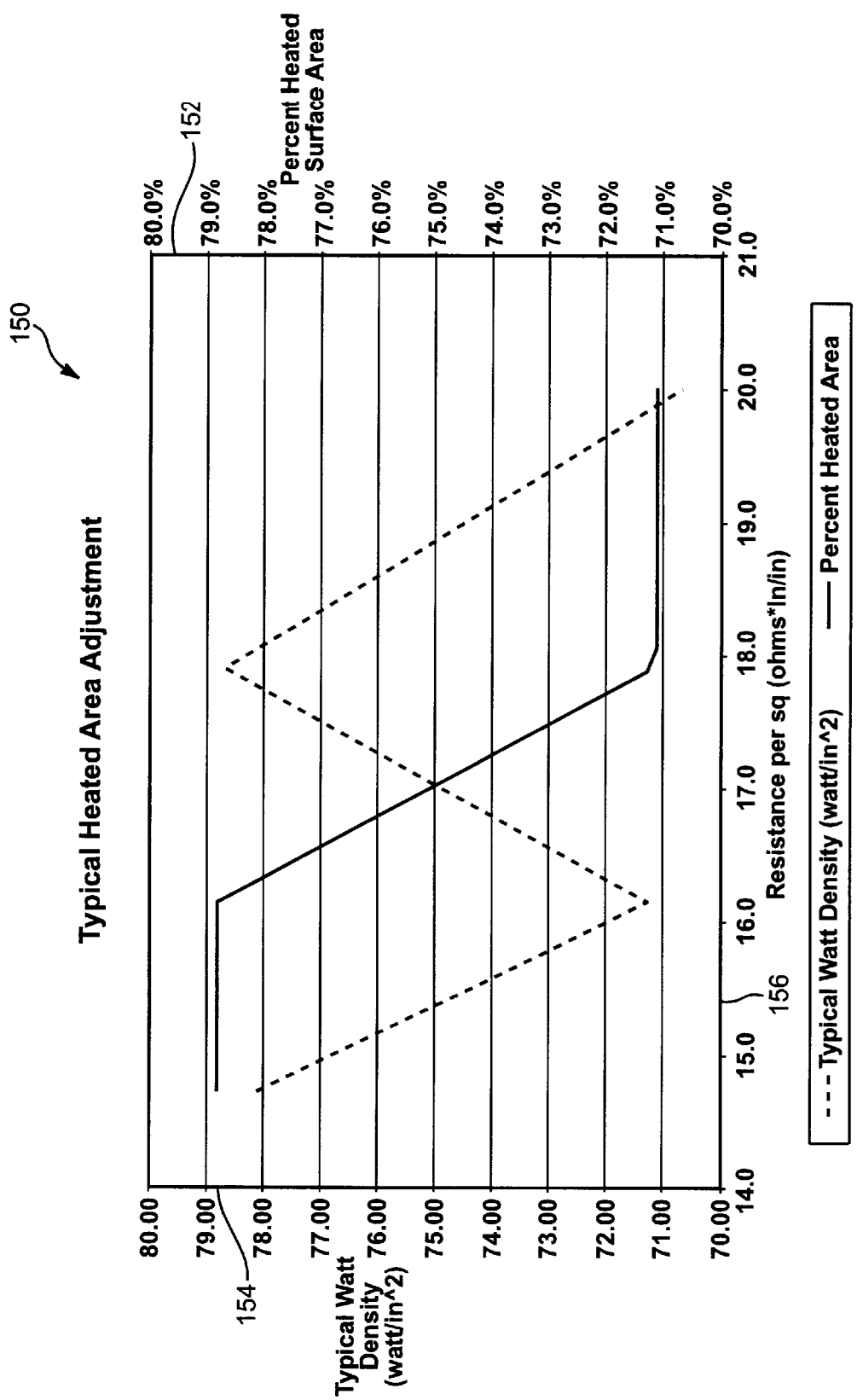
FIG. 8 is a chart illustrating a change in heating area (function of termination distance), in order to correct for variations in cured (heat treated) resistance values in a resistive coating of an apparatus in accordance with the invention.

Referring to FIG. 8, a graph 150 shows both a percentage 152 of available surface area heated by the coating 60 and a watt density 154 as a function of resistance per square 156. The graph 150 shows the correction ability for any given resistivity resulting from the heat-treat process 110. That is, given a particular value of the cured resistance 156, a final percentage 152 of area to be heated (powered) may be determined. Thus, the exact locations of the end coatings may be designed to obtain the desired heated area. Similarly, for a particular cured resistance 156, a watt density 154 may be determined. These results illustrate the influence that the end termination process 112 can have on correcting the overall value of resistance of the coating 60 in an apparatus 10.

Figure 9:
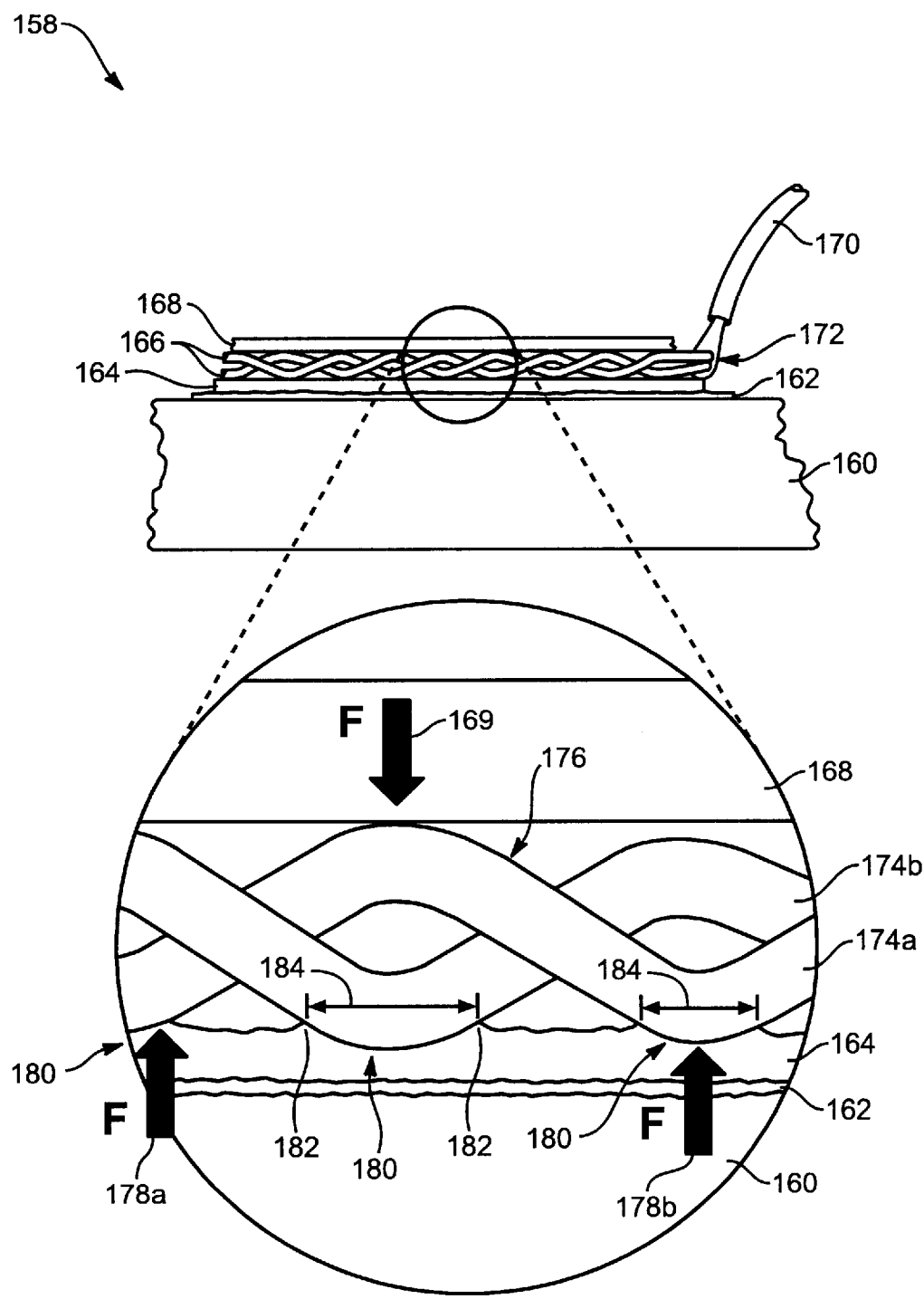
FIG. 9 is a side elevation of a termination in accordance with the present invention.
Figure 10:
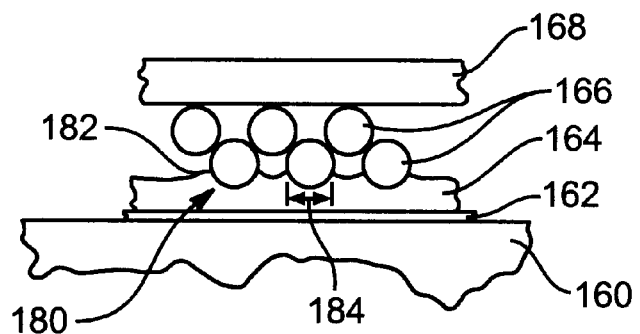
FIG. 10 is section view of the termination illustrated in FIG. 9.
Figure 10:
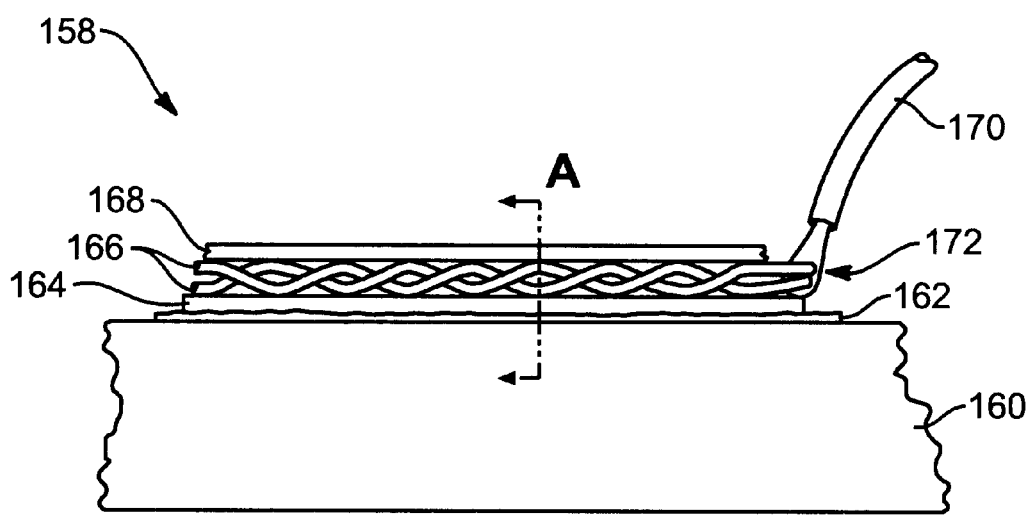

Referring to FIGS. 9 and 10, as discussed hereinabove, a balance exists between the ability of the resistive coating 60 to provide the proper heat dissipation and the ability to maintain mechanical adherence to the substrate 80. As a result, it may be advantageous to have a termination 158 that does not interfere with the mechanical and electrical integrity of the underlying coatings (e.g. resistive coating 60, end coating 63, or interface layer 63) during fabrication or operation.

A termination 158 may distribute mechanical and electrical loads so that load densities are substantially evenly distributed and within acceptable limits and tolerances. Mechanical loads may include all forces, such as shear, tensile, compression, expansion, contraction, and the like, that may be imposed on or by a termination 158. Electrical loads may include voltage differentials, current densities, and the like. Electrical loads and the heating that may accompany them, often cause material expansion and give rise to the mechanical loads. Acceptable tolerances may be defined as a level of mechanical and electrical loading that provides an acceptable termination. The tolerance levels may include a safety factor to provide a more reliable result.

FIGS. 9 and 10 illustrate an embodiment of a termination 158 that may provide the desired mechanical and electrical load distribution. Such a termination 158 may cooperate with a substrate 160. The substrate may be a material selected to meet desired chemical inactivity, heat transfer, strength, rigidity, durability, electrical, mechanical, adhesion, or thermal expansion characteristics. In selected embodiments, the substrate 160 is fused quartz.

The substrate 160 may be prepared to receive a conductive coating 162. As discussed hereinabove, the substrate 160 may be prepared by a mechanical abrasive action, such as grit blasting, bead blasting, sandblasting, or a similar process. The conductive coating 162 may be applied by a suitable method such as plating, depositing, vapor deposition, sputtering, painting, sintering, powder coating, electroless plating, or the like. A suitable material may be chosen as the conductive coating 162. The material may be selected to provide the desired electrical resistivity, electrical conductivity, mechanical strength, adherence to the substrate, or durability. In certain embodiments, the conductive coating 162 comprises nickel applied by an electroless plating process. In other embodiments, other metals, such as gold, silver, copper, etc., having suitable resistance may be used at suitable thicknesses.

In selected applications and embodiments, it may be beneficial to provide an interface layer 164 to extend over the area to which the termination 158 is to be applied. The interface layer 164 may provide a selectively deformable layer to receive a conductor 166. A clamp 168 may apply a mechanical load 169 to the conductor 166 to ensure an effective electrical contact between the conductor 166 and the underlying surface (e.g. interface layer 164). A lead 170 in intimate contact may deliver an electrical load to the conductor at an attachment point 172.

The conductor 166 may be formed to provide mechanical load distribution. For example, the conductor 166 may be formed of multiple strands 174. The strands 174 may be crimped, bent, twisted, woven, or otherwise formed to produce multiple points of contact between themselves and the clamp 168 and/or between themselves and the underlying surface (e.g. interface layer 164). Moreover, formation processes (e.g. crimping, weaving, twisting, etc.) of the strands 174 may effectively create multiple deflectable springs 176. In the illustrated embodiment, the strands 174 are woven to effectively form leaf springs 176 (fibers 176). In such a configuration, a strand 174a and the leaf spring 176 formed therein, may distribute a mechanical load 169 applied by a clamp 168 to create at least two smaller loads 178. In a similar manner, the smaller loads 178 may be distributed, by contact between interleaving fibers 176 (leaf springs 176), thus further propagating the applied load 169 to other locations.

As previously discussed, electrical loads and the heating that may accompany them, often cause thermal expansion of material and give rise to substantial mechanical loads. In many applications, where materials in intimate contact have different coefficients of thermal expansion, this expansion may range from undesirable to catastrophic. For example, an expanding conductor 166 may apply excessive compressive hoop stresses to the conductive coating 162, causing it to separate radially from the lower-expanding or non-expanding substrate 160. Additionally, expansion of the conductor 166 may cause uneven distribution of electrical loads, resulting in hot spots. Hot spots are undesirable for many reasons, including variations in conductivity, electrical overheating, burnout, mechanical distortions and de-lamination, or failure of the termination 158.

The conductor 166 may be formed to distribute thermal expansion, or even redirect it, thus limiting net movement between the conductor 166 and any adjacent material (e.g. interface layer 164, clamp 168). For example, the conductor 166 may be formed of multiple strands 174. The strands 174 may be crimped, bent, twisted, woven, or otherwise formed to produce multiple tortuous paths. The tortuous paths of the strands 174 may create multiple deflectable springs 176 (e.g. leaf springs 176). Upon expansion or contraction of the material of the strands 174, the springs 176 may deflect to absorb the displacement motion induced by the change in physical size. The result may be a substantially limited net expansion of the conductor 166 with respect to its surroundings. This embodiment may be particularly suited for terminations 158 involving several materials with differing coefficients of thermal expansion.

As discussed hereinabove, it may be beneficial to have an interface layer 164. The interface layer 164 may be formed of a suitable material selected to provide a desired combination of adherence, elasticity, plasticity, resistance, and conductivity. The material of the interface layer 164 may be selected to adhere to an underlying coating (e.g. conductive coating 162) without damaging the coating or causing the separation thereof during thermal cycling. The interface layer 164 may also provide a balance of elasticity and plasticity. This balance may support effective electrical contact between the interface layer 164 and the conductor 166. In selected embodiments, the interface layer 164 may be a comparatively thin deposit of solder 164, providing substantially no effective rigidity to the underlying conductive coating 162.

In certain embodiments, the interface layer 164 may elastically deflect and plastically yield locally around contact points 180. As a load 169 is applied, the conductor 166 may embed itself into the interface layer 164 a distance effective to provide increased electrical contact area therebetween. Displaced interface material 182 may form around each fiber 176 (spring 176) increasing the contact area 184 about the principal contact point 180 or contact region 180. Larger contact areas 184 promote lower local electrical resistance and, therefore, decreased heat generation. As discussed, decreased heat generation may reduce thermal expansion and the risk of overheating. The elasticity of the interface layer 164, as well as the lateral bends and springiness of the conductor 166 (fibers 176) may combine to maintain effectively constant electrical contact throughout thermal cycling of operational use. In such a manner, mechanical and electrical loads may be distributed to resist overheating, separation, de-lamination, or other forms of failure.

The conductor 166 may be made of multiple strands 174. The strands 174 may be formed to move, expand, shift, or otherwise reposition substantially independently from one another. That is, movement of one strand 174a does not necessarily require the movement of a neighboring strand 174b. A conductor 166 in accordance with the present invention may be formed from one or more strands 174. The strands 174 may be formed of a suitable material having the desired conductivity, elasticity, malleability or formability, and durability. The conductor 166 may be coated with a material selected to discourage bonding, galling, or sticking thereof to a surrounding surface (i.e. surfaces with which the conductor 166 is in contact with). Silver may operate to improve conductivity and resist galling. In one embodiment, the conductor 166 is a braided strap 166 made of copper strands 174 coated with silver to reduce adherence to an interface layer 164 of solder.

Other films, layers, coatings, or the like may intersperse between the conductive coating 162, interface layer 164, and conductor 166. These coatings (e.g. end coatings 62) may adjust the resistivity of the conductive coating 162, enhance adherence, reduce separation, increase durability, or otherwise enhance the operation of the apparatus 10. The elements of a termination 158 in accordance with the present invention may be applied in conjunction with these other films.

Figure 11:
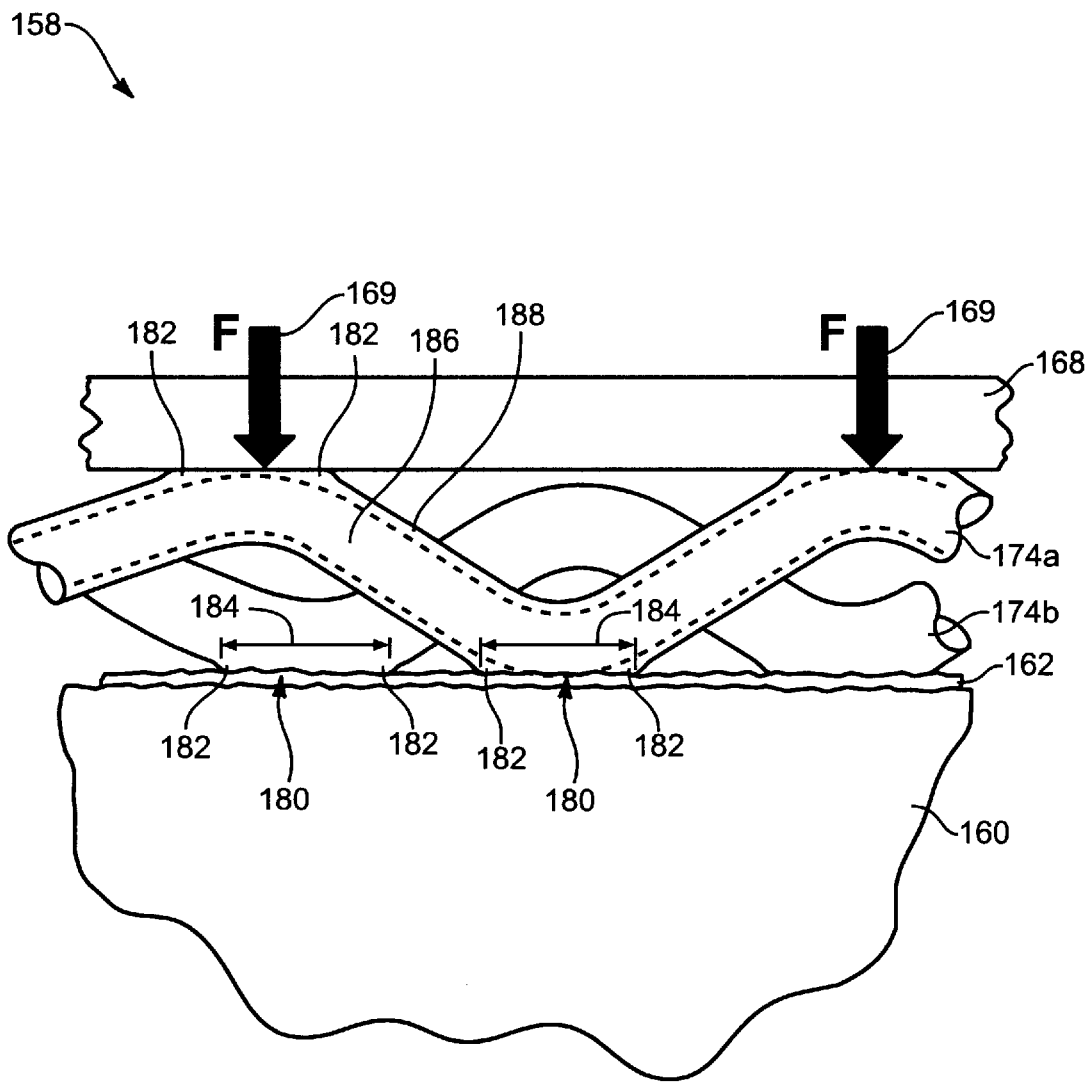
FIG. 11 is a side elevation of an alternative embodiment of a termination in accordance with the present invention.

Referring to FIG. 11, in an alternative embodiment, the interface layer 164 may be omitted. The conductor 166 may include an electrically conductive interior 186 and a compliant exterior 188. The conductive interior 186 may provide the mechanical resilience for the load-distributing spring effect described hereinabove. As a load 169 is applied, the compliant exterior 188 may deform to match the surface against which it is being pressed. Displaced exterior material 182 may increase the contact area 184 of the contact points 180.

Figure 12:
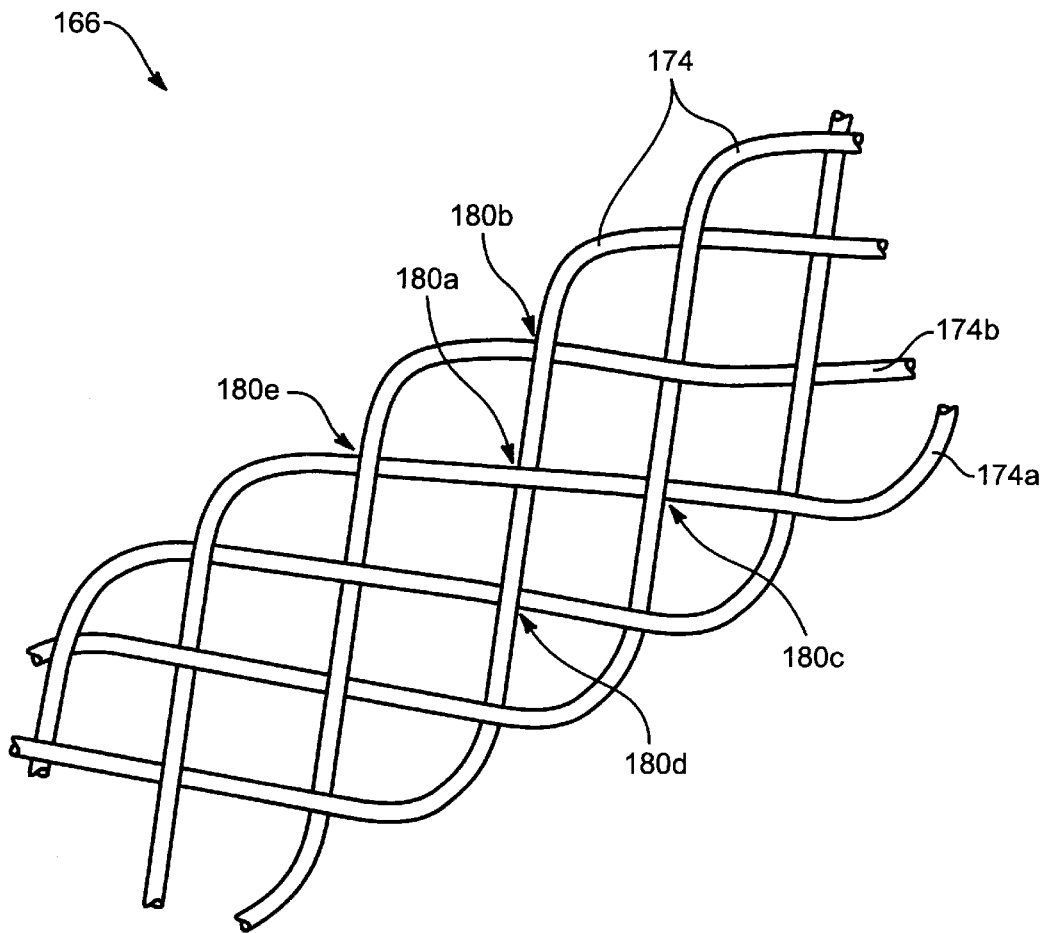
FIG. 12 is plan view of an embodiment of a termination conductor in accordance with the present invention.

Referring to FIG. 12, a conductor 166 in accordance with the present invention may be formed to distribute electrical loads. As discussed hereinabove, hot spots are undesirable because they may result in electrical overheating, burnout, or other failure modes of the termination 158. Distributing electrical loads may greatly reduce the occurrence of hot spots. In selected embodiments, electrical load distribution may be accomplished by a woven or braided conductor 166.

A braided conductor 166 may be made of several conductive strands 174. Each strand 174 may conduct only a fraction of the electrical current of the whole termination 158. As a result, a contact point 180a of reduced or increased electrical resistance on a strand 174a likely will not draw a large portion of the total current applied to the conductor 166 nor be allowed to develop a voltage drop likely to support an arc. Additionally, the decreased resistance of a parallel electron path from a neighboring strand 174b to strand 174a may compensate for the variation in resistance of the contact point 180a thus, reducing the likelihood that an electron will find any path of significantly higher or lower resistance through a neighbor of any contact point 180a.

When a contact point 180a is not actually in contact with the underlying surface (e.g. interface layer 164), electrons may be imparted to the underlying surface at the many neighboring contact points 180b, 180c, 180d, and 180e maintaining low resistance and low voltage drops. In this manner, the occurrence of cold spots, areas of less than average current, or gaps subject to arc, may be reduced.

Figure 13:
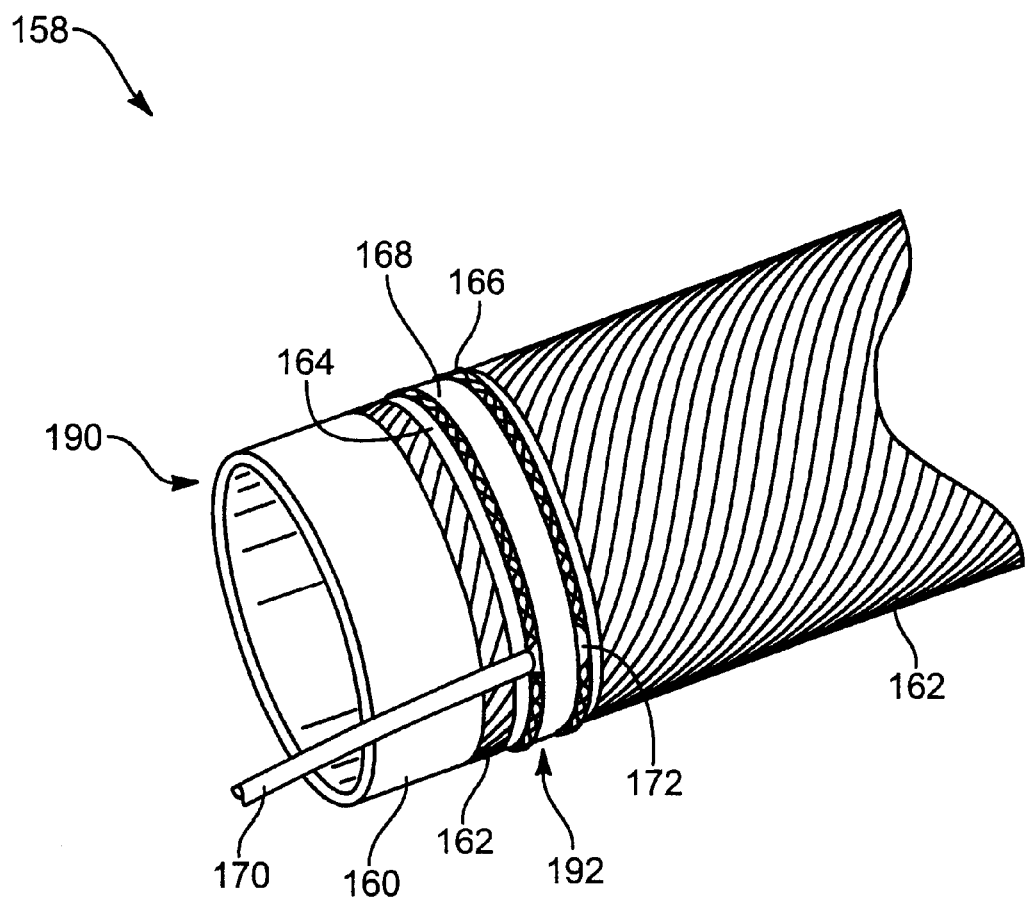
FIG. 13 is a perspective view of a termination in accordance with the present invention as applied to a conduit for heating fluids passing therethrough.

FIG. 13 illustrates one selected embodiment of a termination 158 in accordance with the present invention. A substrate 160 may be formed into a cylindrical conduit 190. The substrate 160 may be prepared and then coated with a conductive coating 162 for providing a pre-determined balance of resistance and current flow. An interface layer 164 may be placed over the conductive coating 162 in the termination zone 192. In the illustrated embodiment, the termination zone 192 is a circular continuous band. A conductor 166 (e.g. a braided strap) may be placed directly against the termination zone 192, thus, encircling the conduit 190. A lead 170 may conductively secure (e.g. by solder or other mechanical joint) to the conductor 166 at an attachment point 172. A clamp 168 may circumferentially encircle the conductor 166 and maintain a contact force of each strand 174 against the interface layer 164 in a direction normal to the surface. The clamp 168 may be a comparatively strong clamp 168 circumferentially configured to flex enough to equalize radial stresses. In selected embodiments, the conductor 166 may be scored or otherwise shaped to create a channel 194 or circumferential indentation 194 to facilitate rapid alignment and assembly of the clamp 168.

From the above discussion, it will be appreciated that the present invention provides apparatus and methods for heating ultra pure fluids in a hyper-clean environment. Power densities are very high, while heater reliability is superior. Meanwhile, manufacturing is rapid yet reliable, and adjustments are available to produce high yields of highly predictable product.

The present invention may be embodied in other specific forms without departing from its spirit or essential characteristics. The described embodiments are to be considered in all respects only as illustrative, and not restrictive. The scope of the invention is, therefore, indicated by the appended claims, rather than by the foregoing description. All changes which come within the meaning and range of equivalency of the claims are to be embraced within their scope.

What is claimed and desired to be secured by United States Letters Patent is:

1. A heater for fluids, the heater comprising:
    a conduit having a wall and a surface, the conduit being made of quartz, formed to enclose and convey a fluid;
    the conduit wherein the surface is roughened mechanically, and not chemically etched, to secure a coating thereto; and
    a conductor, electrically resistive and extending on the roughened surface to adhere thereto by micromechanical gripping.

2. The heater of claim 1, wherein the roughened surface extends a first selected length along the conduit.

3. The heater of claim 2, wherein the conductor adheres to the roughened surface to extend a second selected length along the conduit.

4. The heater of claim 3, wherein the first selected length is longer than the second selected length.

5. The heater of claim 4, further comprising a first termination secured to the conductor at a first location to provide current thereto.

6. The heater of claim 5, further comprising a second termination secured to the conductor at a second location, spaced from the first location, to receive current therefrom.

7. The heater of claim 6, wherein the first termination comprises a first band comprising separable and electrically conductive strands.

8. The heater of claim 7, wherein the first termination further comprises a first clamp to apply a clamping load urging the first band toward the conductor.

9. The heater of claim 8, wherein the strands of the first band distribute mechanical stress and strain induced by thermal expansion and the clamping load sufficiently to substantially reduce damage to the mechanical and electrical integrity of the conductor.

10. The heater of claim 9, wherein the second termination comprises:
    a second band comprising separable and electrically conductive strands; and
    a second clamp to apply a clamping load urging the second band toward the conductor.

11. The heater of claim 1, further comprising a termination to apply electricity to the conductor, the termination comprising:
    a source of electricity in electrical communication with a band;
    the band comprising separable and electrically conductive strands;
    a clamp to apply a clamping load urging the band toward the conductor; and
    the strands of the band distributing mechanical stress and strain induced by thermal expansion and the clamping load sufficiently to substantially reduce damage to the mechanical and electrical integrity of the conductor.

12. A method for forming a resistor, the method comprising:
    selecting a coating comprising a resistive material having a first coefficient of thermal expansion;
    roughening a surface of a substrate material, having a second coefficient of thermal expansion less than the first coefficient of thermal expansion; and
    plating the resistive material onto the roughened surface in a crepe pattern to substantially limit the ability of the resistive material to resist bending in response to thermal stress.

13. The method of claim 12, wherein the substrate material is a quartz conduit.

14. The method of claim 13, wherein the surface of the substrate material is the outer surface of the quartz conduit.

15. The method of claim 14, wherein the roughened surface is characterized by a multitude of protrusions and cavities dispersed therethroughout.

16. The method of claim 15, wherein the crepe pattern is formed by the resistive material conforming to the protrusions and cavities of the roughened surface when applied thereto.

* * * * *

UNITED STATES PATENT AND TRADEMARK OFFICE
CERTIFICATE OF CORRECTION

| | |
|---|---|
| PATENT NO. | : 6,674,053 B2 |
| APPLICATION NO. | : 10/218194 |
| DATED | : January 6, 2004 |
| INVENTOR(S) | : Bullock et al. |

It is certified that error appears in the above-identified patent and that said Letters Patent is hereby corrected as shown below:

At column 1, line 5, the recitation of priority should read --This Patent Application is a continuation of U.S. Patent Application Serial No. 09/882,455 filed on Jun. 14, 2001, now U.S. Patent No. 6,433,319 issued Aug. 13, 2002 and entitled ELECTRICAL, THIN FILM TERMINATION, which is a continuation-in-part of U.S. Patent Application Serial No. 09/738,724 filed on Dec. 15, 2000 entitled DURABLE, NON-REACTIVE, RESISTIVE FILM HEATER, now U.S. Patent No. 6,580,061 issued Jun. 17, 2003 and entitled DURABLE, NON-REACTIVE, RESISTIVE FILM HEATER, which claims the benefit of U.S. Provisional Patent Application Serial No. 60/179,541 filed on Feb. 1, 2000 entitled DURABLE, NON-REACTIVE, RESISTIVE FILM HEATER.--.

At column 1, line 65, "0 C. to 180 C." should be changed to --0°C. to 180°C.--.

At column 3, line 4, "urged" should be changed to --urge--.

At column 6, line 67, --.-- should be inserted after "propagation".

At column 7, line 50, "an" should be changed to --and--.

At column 7, line 53, "be" should be deleted.

At column 8, line 7, "provided" should be changed to --provide--.

At column 8, line 15, "advantageous" should be changed to --advantages--.

UNITED STATES PATENT AND TRADEMARK OFFICE
CERTIFICATE OF CORRECTION

PATENT NO. : 6,674,053 B2
APPLICATION NO. : 10/218194
DATED : January 6, 2004
INVENTOR(S) : Bullock et al.

It is certified that error appears in the above-identified patent and that said Letters Patent is hereby corrected as shown below:

At column 9, line 8, "a" should be changed to --an--.

Signed and Sealed this

Twentieth Day of February, 2007

JON W. DUDAS
*Director of the United States Patent and Trademark Office*